United States Patent

Koyasu et al.

[11] Patent Number: 6,034,556
[45] Date of Patent: Mar. 7, 2000

[54] SAMPLE-AND-HOLD CIRCUIT INCLUDING OPERATIONAL AMPLIFIER AS AN INPUT CIRCUIT

[75] Inventors: Takahisa Koyasu, Nishio; Mitsuhiro Saitou, Obu; Hiroyuki Ban, Hazu-gun, all of Japan

[73] Assignee: Denso Corporation, Kariya, Japan

[21] Appl. No.: 09/019,363

[22] Filed: Feb. 5, 1998

[30] Foreign Application Priority Data

Feb. 5, 1997 [JP] Japan ................................. 9-022895
Apr. 2, 1997 [JP] Japan ................................. 9-084198

[51] Int. Cl.[7] ................................................ G11C 27/02
[52] U.S. Cl. ............................................................ 327/96
[58] Field of Search .......................... 327/91, 93, 94–97, 327/376.378; 341/122, 123

[56] References Cited

U.S. PATENT DOCUMENTS 5,047,666  9/1991  Astegher et al. ........................... 327/94
5,289,278  2/1994  Bird ........................................... 348/473
5,471,171  11/1995  Itakura et al. ............................ 330/253

FOREIGN PATENT DOCUMENTS 64-49318   2/1989   Japan.
7-52816    6/1995   Japan.
2 301 901  12/1996  United Kingdom.

*Primary Examiner*—My-Trang Nuton
*Attorney, Agent, or Firm*—Pillsbury Madison & Sutro LLP

[57] ABSTRACT

An operational amplifier charges a charge storage capacitor in response to an input signal supplied to a non-inverting input terminal. When a switching signal is low, NPN transistors disposed in an output open circuit are on. Therefore, output transistors disposed in a push-pull circuit are off and the output signal is cut off. Further, in this situation, the potential of a phase compensation capacitor is held because AC coupling of the phase compensation capacitor does not occur.

19 Claims, 9 Drawing Sheets

6,034,556

SAMPLE-AND-HOLD CIRCUIT INCLUDING OPERATIONAL AMPLIFIER AS AN INPUT CIRCUIT

CROSS REFERENCES TO RELATED APPLICATIONS

This application is based upon and claims priority from Japanese Patent Application Nos. Hei 9-22895 filed on Feb. 5, 1997 and Hei 9-84198 filed on Apr. 2, 1997, the contents of which are incorporated herein by references.

BACKGROUND OF THE INVENTION

1. Field of the Invention

The present invention relates to a sample-and-hold circuit including an operational amplifier as an input circuit.

2. Related Art

A conventional sample-and-hold circuit has an operational amplifier, an analog switch and a charge storage capacitor which holds a potential charge therein. However, when the conventional sample-and-hold circuit is built in a monolithic integrated circuit (IC), a BiCMOS process, which will increase the cost of IC production, is needed because the operational amplifier is made of bipolar transistors and the analog switch is made of a MOSFET. An operational amplifier is known in which output transistors forming a push-pull circuit are cut off in response to a control signal. However, if an input signal drastically changes while the output signal is held, an AC coupling may occur at a phase compensation capacitor disposed in the operational amplifier. This causes the AC coupled signal to be transferred to the push-pull circuit. Thus, the potential of a charge storage capacitor to which the operational amplifier is connected may change, and the output signal may also change.

SUMMARY OF THE INVENTION

The present invention is made in light of the foregoing problems, and it is an object of the present invention to provide a sample-and-hold circuit which does not include an analog switch, and in which an output signal is not influenced by changes in the input signal when the output signal is held.

According to the sample-and-hold circuit of the present invention, when a hold signal is supplied to an output open circuit, the output open circuit cuts off output transistors disposed in a push-pull circuit, and fixes the potential of a phase compensation capacitor. Thus, if the input signal changes drastically, the changed input signal is not transferred to the push-pull output circuit because the phase compensation capacitor in not AC coupled to the output circuit. As a result, the output signal (potential of the charge storage capacitor) is not changed and is firmly fixed.

When resistors are disposed between bases and emitters of the output transistors, the output transistors are prevented from breaking down because the bases of the output transistors are held at the same potential as the emitters when the output transistor are off.

BRIEF DESCRIPTION OF THE DRAWINGS

Other features and advantages of the present invention will be appreciated, as well as the method of operation and the function of the related parts, from a study of the following detailed description, the appended claims, and the drawings, all of which form a part of this application. In the drawings:

DETAILED DESCRIPTION OF THE PREFERRED EMBODIMENTS

Preferred embodiments of the present invention will now be described in detail with reference to the drawings.

Figure 1:
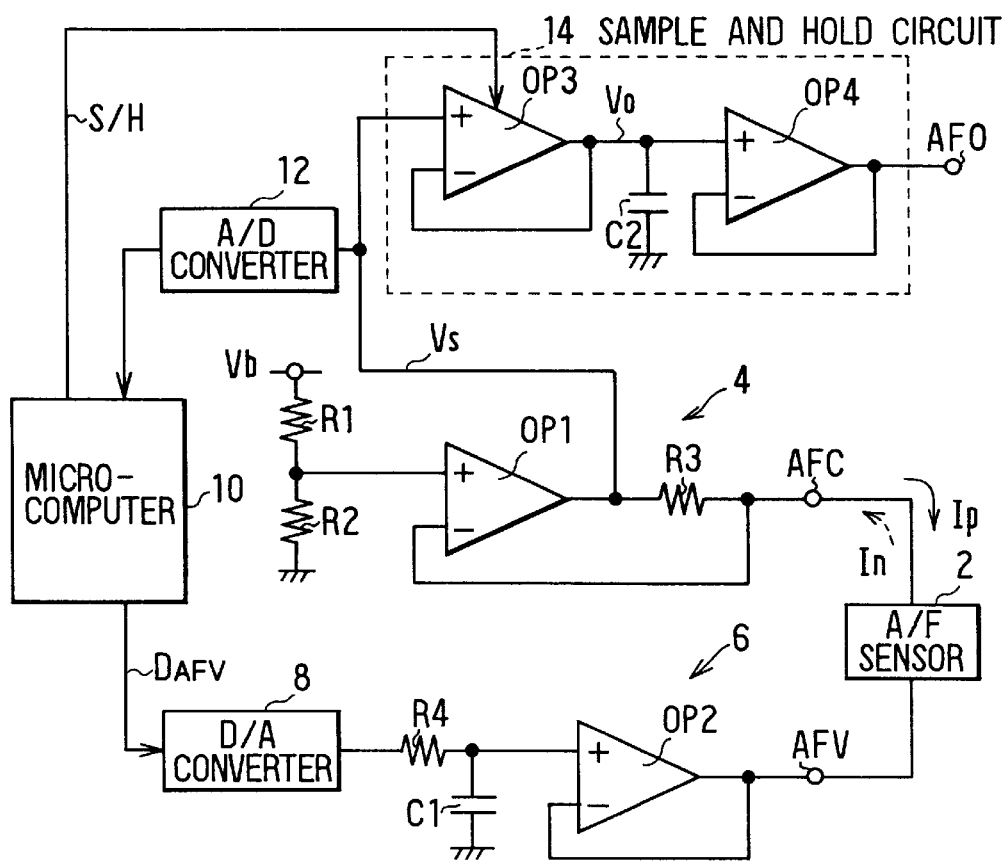
FIG. 1 is a block diagram of an air-fuel (A/F) detecting apparatus according to the present invention.

FIG. 1 illustrates a block diagram of an air-fuel detecting apparatus according to the present invention. This air-fuel detecting apparatus detects an air-fuel ratio (A/F) of an air-fuel mixture provided to an internal combustion engine by detecting the concentration of oxygen in the exhaust gas of the internal combustion engine. As shown in FIG. 1, the air-fuel detecting apparatus includes an A/F sensor 2 installed in an exhaust pipe. A constant-voltage output circuit 4 applies a constant voltage, AFC, (for instance 3 V) to one end of A/F sensor 2. A driving voltage output circuit 6 is connected to the other end of the A/F sensor 2 and applies a driving voltage, AFV, which is used for detecting the A/F ratio measured by and the internal resistance of A/F sensor 2.

Figure 2:
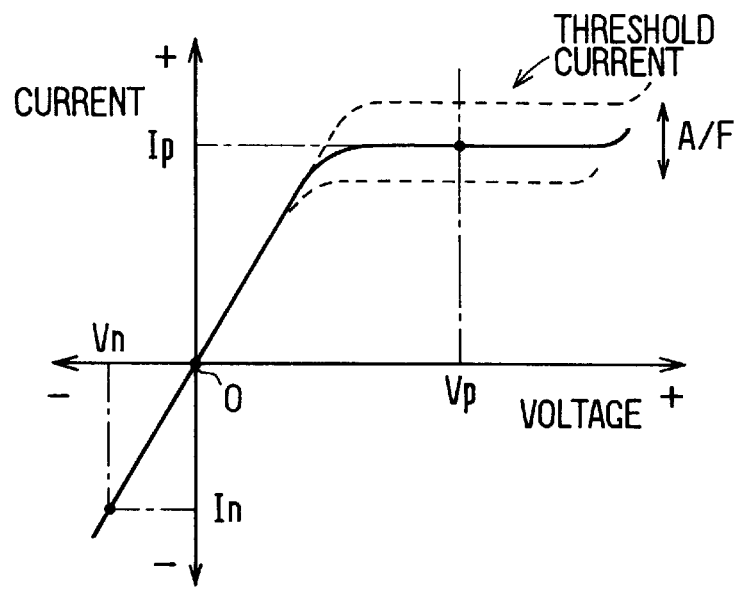
FIG. 2 is a graph indicating a relationship between voltage and current in an A/F sensor to explain detection of an A/F ratio and an internal resistance in the air-fuel detecting apparatus.

The A/F sensor 2 has an inner electrode exposed to the exhaust gas and an outer electrode exposed to the air. When a voltage is applied across the electrodes so that the voltage of the inner electrode is higher than that of the outer electrode, current flows from the inner electrode to the outer electrode. However, as shown in FIG. 2, for a given amount of oxygen, the current flowing through the A/F sensor 2 is constant (threshold current Ip) in a predetermined range even if the voltage applied across the electrodes changes. The threshold current Ip changes depending on the amount of oxygen present.

In this embodiment, the constant-voltage output circuit 4 applies the constant voltage AFC (3 V) to one end of the A/F sensor 2 (inner electrode), and the driving voltage output circuit 6 applies the driving voltage AFV (2.7 V), which is lower than the constant voltage AFC, to the other end of the A/F sensor 2 (outer electrode). The potential difference between the inner electrode and the outer electrode results in an A/F detection voltage Vp (=AFC−AFV; +300 mV) which creates the threshold current Ip. The A/F ratio is determined by measuring the threshold current Ip with the A/F detection voltage Vp being applied to the A/F sensor 2.

Further a heater (not shown) is installed in the air-fuel detecting apparatus to heat the A/F sensor 2 and keep the temperature of the A/F sensor 2 constant (for instance 700 degrees centigrade), because the A/F sensor 2 does not work below a predetermined temperature, and the detected A/F ratio changes in response to the temperature of the A/F sensor 2. Thus, it is necessary to detect the temperature of the A/F sensor 2 and control the amount of the current which flows to the heater in order to keep the temperature of the A/F sensor 2 constant.

In this embodiment, in order to detect temperature, the driving voltage AFV is periodically, temporarily set to a predetermined high voltage (3.3 V) which is higher than the constant voltage AFC (3 V). The potential difference between the inner electrode and the outer electrode results in an internal resistance detection voltage Vn (=AFC−AFV; −300 mV) which has a potential which is opposite to the potential of the A/F detection voltage Vp. When a current In which flows through the A/F sensor 2 is measured, the internal resistance Rn of the A/F sensor 2, corresponding to the temperature of the A/F sensor 2, is detected based on the current In and the internal resistance detection voltage Vn (shown in FIG. 2).

When the internal resistance detection voltage Vn is applied to the two electrodes in the A/F sensor 2 to detect the internal resistance Rn, the current temporarily flows in the opposite direction, causing oxygen to be absorbed on the inner electrode. In this condition, the A/F ratio may not be precisely detected until the oxygen is removed from the inner electrode, even if the direction of voltage applied to the A/F sensor 2 is reversed after the internal resistance Rn is detected. To solve this problem, in this embodiment, after the driving voltage AFV is set high, the driving voltage AFV is temporally set to a predetermined low voltage (2.4 V), which is lower than the normal driving voltage AFV (2.7 V) used for detecting the A/F ratio. That is, a return voltage (+600 mV) which is the same polarity and higher than the A/F detection voltage Vp is applied to the A/F sensor 2. As a result, the oxygen absorbed on the inner electrode is removed so that the A/F sensor 2 detects the A/F ratio.

Further, the air-fuel detecting apparatus includes a microcomputer 10 used for changing the driving voltage AFV and controlling the heater so that A/F detection, internal resistance detection and oxygen removal processing can be executed.

Figure 3:
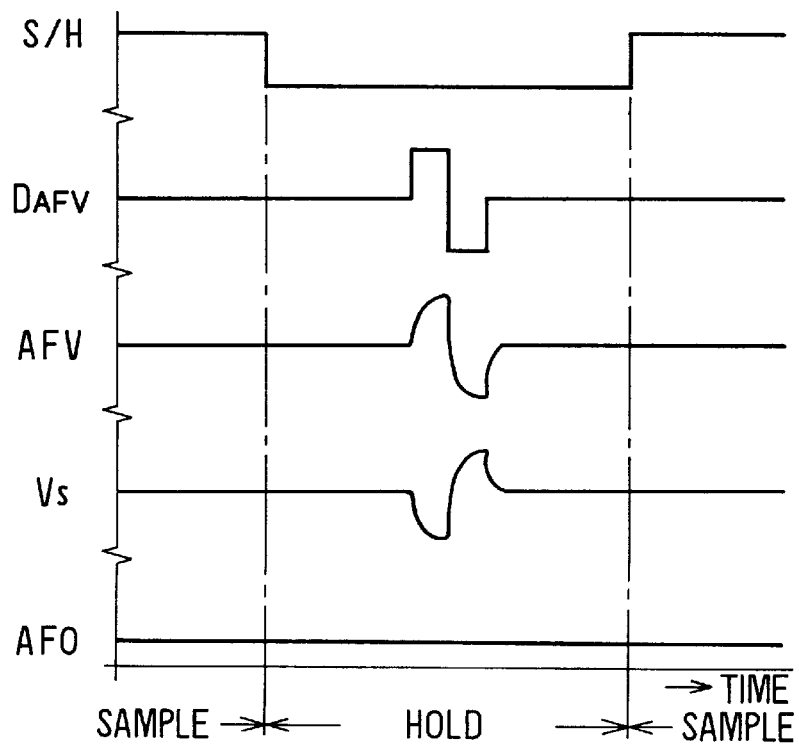
FIG. 3 is a timing chart indicating waveforms of signal in the air-fuel detecting apparatus.

The operation of the constant-voltage output circuit 4 and the driving voltage output circuit 6 are as follows. First, a command signal DAFV is supplied to the driving voltage output circuit 6 from the microcomputer 10 through a D/A converter 8. This analog signal is smoothed at an integrating circuit which consists of a resistor R4 and a capacitor C1 and output to the outer electrode of the A/F sensor 2 through a buffer circuit (operational amplifier OP2) as driving voltage AFV (shown in FIG. 3). Usually, the microcomputer 10 outputs the command signal DAFV so that the driving voltage AFV is set to a predetermined voltage for detecting the A/F ratio. However, periodically (every 128 msec), the command signal DAFV output from the microcomputer 10 is changed for a predetermined time (4.5 msec) so that the driving voltage AFV is sequentially set to other predetermined voltages for detecting the internal resistance and removing the oxygen from the inner electrode.

The constant-voltage output circuit 4 consists of voltage dividing resistors R1 and R2 which generate a standard voltage from a source voltage Vb (5 V), and an operational amplifier OP1 whose non-inverting input terminal is connected to the connection point between the resistor R1 and the resistor R2. The inverting input terminal of the operational amplifier OP1 is connected to the inner terminal of A/F sensor 2, and output terminal of the operational amplifier OP1 is connected to the inner terminal of A/F sensor 2 through a resistor R3. The output terminal of the operational amplifier OP1 outputs a predetermined voltage so that the voltage applied to the inner electrode of the A/F sensor 2 is the same as the standard voltage generated by resistors R1 and R2. Thus, the voltage applied to the inner electrode is a constant voltage AFC which is the same as the standard voltage. Because the current which flows through the resistor R3 is the same as the current which flows through the A/F sensor 2, the voltage at the output terminal of the operational amplifier OP1 changes in response to the current which flows through the A/F sensor 2. Thus, in this embodiment, the voltage at the output terminal of the operational amplifier OP1 is regarded as a detection voltage Vs (shown in FIG. 3) for detecting the A/F ratio and the internal resistance Rn. The detection voltage Vs which is detected when the driving voltage AFV is set to the voltage for detecting the internal resistance Rn is input to the microcomputer 10 through an A/D converter 12. In the microcomputer 10, the current In {=(AFC−Vs)/R3} which flows through the A/F sensor 2 is calculated based on the detection voltage Vs, the resistance of the resistor R3 and the constant voltage AFC applied to the A/F sensor 2. The internal resistance Rn (=Vn/In) of the A/F sensor 2 is calculated based on the current In and the internal resistance detection voltage Vn. The current which flows through the heater is controlled by the microcomputer 10 so that the internal resistance Rn remains constant (i.e. the temperature of the A/F sensor 2 remains constant).

Because the detection voltage Vs, which is detected when the driving voltage AFV is set to the voltage for detecting the A/F ratio, changes in response to the threshold current Ip which flows through the A/F sensor 2, it indicates the A/F ratio. Therefore, the detection voltage Vs is output to a control unit which controls the amount of fuel supply to the internal combustion engine, for instance. However, if the detection voltage Vs is directly output to the control unit of the internal combustion engine, the detection voltage Vs does not correspond to the A/F ratio when the internal resistance Rn is being detected or when oxygen is being removed from the inner electrode. Thus, the control unit can not control the amount of fuel or the A/F ratio. To solve this problem, the air-fuel detecting apparatus according to this invention has a sample-and-hold circuit 14 which outputs the detection voltage Vs to the control unit. When the A/F ratio is detected, the sample-and-hold circuit 14 directly outputs the detection voltage Vs as a detection signal AFO concerning the A/F ratio to the control unit. When the internal resistance Rn is being detected or when oxygen is being removed, the sample-and-hold circuit 14 outputs a voltage previously sampled when the A/F ratio was being detected as a detection signal AFO to the control unit. In order to accomplish above-described operations, switching signals for sampling and holding are input to the sample-and-hold circuit 14 from the microcomputer 10, and when the level of switching signal is low, the sample-and-hold circuit 14 holds the detection voltage Vs (shown in FIG. 3).

As shown in FIG. 1, the sample-and-hold circuit 14 includes operational amplifiers OP3, OP4 and a charge storage capacitor C2. An output terminal of the operational amplifier OP3 is connected to one end of the charge storage capacitor C2 and with its inverting input terminal (−). A non-inverting input terminal is connected to the output terminal of the operational amplifier OP1 to receive the detection voltage Vs. The other end of the charge storage capacitor C2 is connected to ground. The operational amplifier OP4 is a buffer circuit and outputs the voltage held by capacitor C2 as the detection signal AFO to the control unit. The non-inverting input terminal of the operational amplifier OP4 is connected to the output terminal of the operational amplifier OP3, and the inverting input terminal of the operational amplifier OP4 is connected to its output terminal.

The operational amplifier OP3 receives the switching signal S/H for controlling sampling and holding. When the switching signal S/H is high, the operational amplifier OP3 samples the detection voltage Vs and outputs a signal Vo, which is the same potential as the detection voltage Vs, to the capacitor C2 and the operational amplifier OP4. When the switching signal S/H is low, the operational amplifier OP3 causes the detection voltage Vs to be stored by capacitor C2 and cuts off output transistors in the push-pull output circuit of operational amplifier OP3, and makes output of operational amplifier OP3 open. As a result, when the detection voltage Vs is held, the voltage which is stored on the charge storage capacitor C2 during the sampling period output from the operational amplifier OP4, and the detection signal AFO which is output to the control unit is held.

Figure 4:
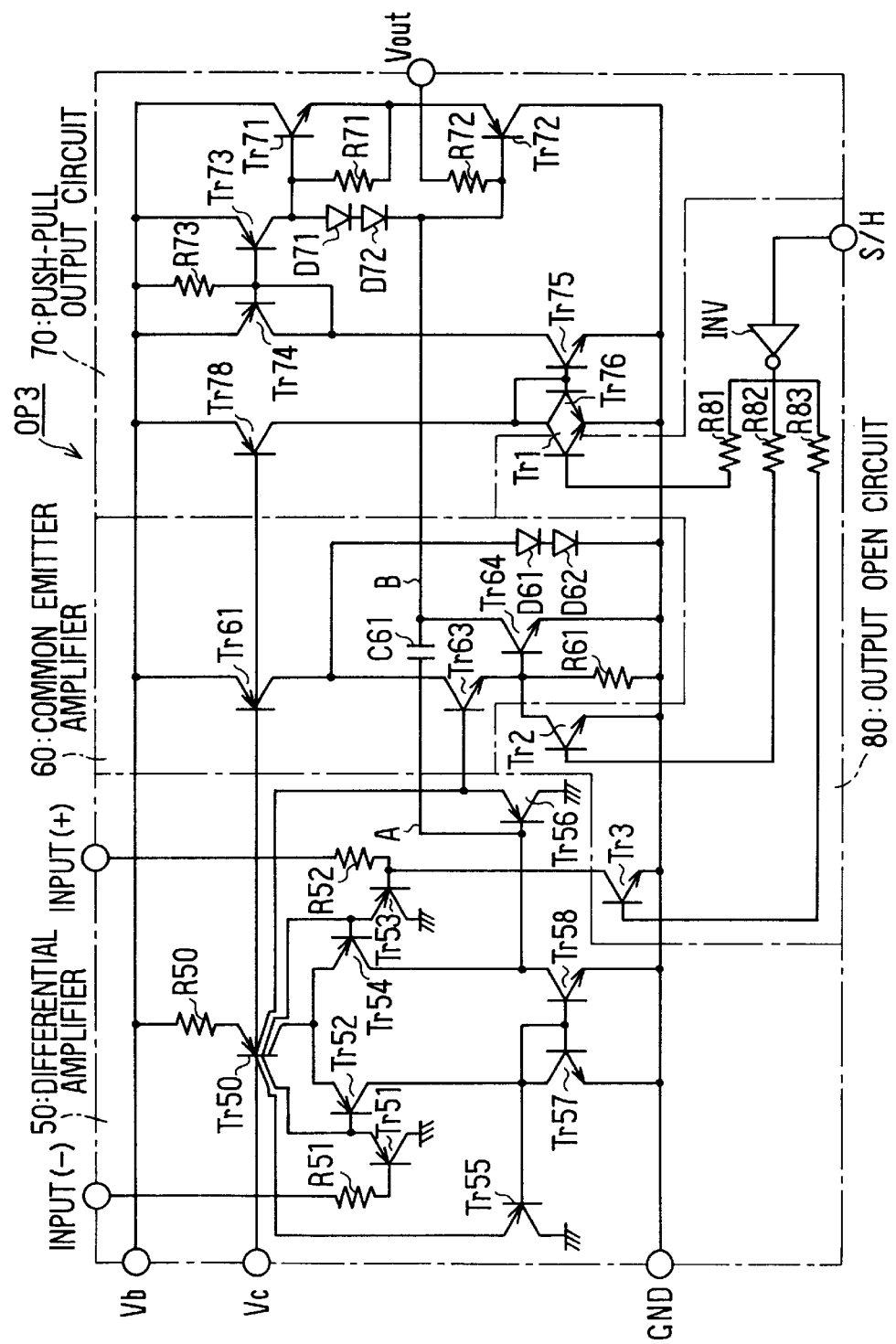
FIG. 4 is a circuit diagram of an operational amplifier OP3 included in a sample-and-hold circuit 14 shown in FIG. 1 according to a first embodiment.

The construction and operation of the operational amplifier OP3 are now described in detail. As shown in FIG. 4, the operational amplifier OP3 has a power terminal which is applied with source voltage Vb and a ground terminal connected to ground. The operational amplifier OP3 has a differential amplifier 50 as an input circuit, a common emitter amplifier 60 which amplifies the output from the differential amplifier 50, and a push-pull output circuit 70 as an output stage. Further, the operational amplifier OP3 has an input terminal to which the switching signal S/H is input from the microcomputer 10, and an output open circuit 80 which makes the output of the push-pull circuit 70 open when the low level switching signal S/H, which causes the detection voltage Vs to be held, is applied to the input terminal.

The differential amplifier 50 has a PNP transistor Tr50 whose emitter is connected to a power line (source voltage Vb) through resistor R50 and whose base is connected to the control terminal which is supplied with the control signal Vc for controlling current through the transistor Tr50. Five collectors of the transistor Tr50 output constant current corresponding to control signal Vc. The PNP transistor Tr50 is a current source of the differential amplifier 50. Further, the differential amplifier 50 has eight transistors as follows: a PNP transistor Tr51 whose base is connected to the inverting input terminal (− input) through a resistor R51, whose emitter is connected to the first collector of the PNP transistor Tr50, and whose collector is connected ground; a PNP transistor Tr52 whose base is connected to the emitter of the PNP transistor Tr51, and whose emitter is connected to the second collector of the PNP transistor Tr50; a PNP transistor Tr53 whose base is connected to the non-inverting input terminal (+ input), whose emitter is connected to the third collector of the PNP transistor Tr50, and whose collector is connected to ground; a PNP transistor Tr54 whose base is connected to the emitter of the PNP transistor Tr53 and whose emitter is connected to the emitter of the PNP transistor Tr52 and with the second collector of the PNP transistor Tr50; a PNP transistor Tr55 whose emitter is connected to the fourth collector of the PNP transistor Tr50, whose base is connected to a collector of the PNP transistor Tr52, and whose collector is connected to ground; a PNP transistor Tr56 whose emitter is connected to the fifth collector of the PNP transistor Tr50, whose base is connected to a collector of the PNP transistor Tr54, and whose collector is connected ground; an NPN transistor Tr57 whose collector is connected to the collector of the PNP transistor Tr52 and the base of the PNP transistor Tr55, whose emitter is connected to ground, and whose base is connected to its collector; and an NPN transistor Tr58 whose collector is connected to the collector of the PNP transistor Tr54 and the base of the PNP transistor Tr56, whose emitter is connected to ground, and whose base is connected to base of the NPN transistor Tr57, and forms a current mirror circuit with the NPN transistor Tr57.

The common emitter amplifier 60 includes a PNP transistor Tr61 whose emitter is connected to the power line and whose base is connected to the base of the PNP transistor Tr50, and which outputs constant current from its collector; an NPN transistor Tr63 whose base is connected to the emitter of the PNP transistor Tr56, and whose emitter is connected to ground through the resistor R61; an NPN transistor Tr64 whose base is connected to the emitter of the NPN transistor Tr63, whose emitter is connected to ground, and whose collector is connected to the base of the PNP transistor Tr56 through a phase compensation capacitor C61; and a pair of diodes D61 and D62 serially connected between the collector of the NPN transistor Tr63 and ground.

The differential amplifier 50 shown in FIG. 4 inputs signals from the inverting input terminal (− input) and the non-inverting input terminal(+ input) through PNP transistors Tr51 and Tr52, which are Darlington connected, and PNP transistors Tr53 and Tr54 which are also Darlington connected. The common emitter circuit 60 compensates for phase differences with the phase compensation capacitor C61. A voltage corresponding to the potential difference of the input signals which are input to the inverting input terminal and the non-inverting input terminal is generated at the collector of the NPN transistor Tr64 which is a signal output portion of the common emitter amplifier 60.

The push-pull circuit 70 has an NPN transistor Tr71 for outputting the signal Vo, whose collector is connected to the power line, and whose emitter is connected to the output terminal; and a PNP transistor Tr72, whose collector is connected to ground, and whose emitter is connected to the output terminal. A resistor R71 is connected between the base and emitter of the NPN transistor Tr71 and a resistor R72 is connected between the base and emitter of PNP transistor Tr72. A pair of diodes D71 and D72 are serially connected between the base of NPN transistor Tr71 and the base of PNP transistor Tr72, so that the anode is connected to the base of the NPN transistor Tr71 and the cathode is connected to the base of the PNP transistor Tr72. The diodes D71 and D72 keep the voltage between the base of NPN transistor Tr71 and the base of PNP transistor D72 at a value corresponding to the forward biased voltage drop across two diodes (approximate 1.4 V) so that each transistor Tr71 and Tr72 can operate when bias current is supplied to transistors Tr71 and Tr72.

The base of the PNP transistor Tr72 is connected to the collector of the NPN transistor Tr64 which is the output transistor of the common emitter amplifier 60. A PNP transistor Tr73, which supplies the bias current to the NPN transistor Tr71 and the PNP transistor Tr72, has an emitter connected to the power line and a collector connected to the base of the NPN transistor Tr71. The base of PNP transistor Tr73 is connected to the base of a PNP transistor Tr74. The PNP transistor Tr73 and the PNP transistor TR74 form a first current mirror circuit. The emitter of PNP transistor Tr74 is connected to the power line and the collector of the PNP transistor Tr74 is connected to its base. The bases of PNP transistors Tr73 and Tr74 are connected to the power line through a resistor R73.

The collector of the PNP transistor Tr74 is connected to a collector of NPN transistor Tr75, whose emitter is connected to ground. A base of NPN transistor Tr75 is connected to a base of an NPN transistor Tr76. An emitter of the NPN transistor Tr76 is connected to ground, and a collector of the NPN transistor Tr76 is connected to its base. The collector of the NPN transistor Tr76 is also connected to the collector of a PNP transistor Tr78 whose emitter is connected to the power line. A base of PNP transistor Tr78 is connected to a control terminal which is supplied with a current control signal Vc along with the bases of the PNP transistor Tr50 in the differential amplifier 50 and the PNP transistor Tr61 in the common emitter amplifier 60.

As a result, the PNP transistor Tr78 operates as a current source which supplies constant current from the power line through the NPN transistor Tr76. Because the NPN transistor Tr76 and the NPN transistor Tr75 form a second current mirror circuit, a constant current flows through the NPN transistor Tr75. Also, the constant current flows through the PNP transistor Tr74 and the PNP transistor Tr73 because of the same operation as the NPN transistor Tr76 and the NPN transistor Tr75.

The output open circuit 80 has an inverter INV which reverses the high/low level of switching signal S/H sent from the microcomputer 10, three NPN transistors Tr1–Tr3, and three resistors R81–R83 connected between bases of the three NPN transistors Tr1–Tr3, respectively, and with the inverter INV. The NPN transistor Tr1 has a collector connected to the collector of the NPN transistor Tr76 in the push-pull output circuit 70, and an emitter connected to the emitter of the NPN transistor Tr76. The NPN transistor Tr2 has a collector connected to the base of NPN transistor Tr64 in the common emitter amplifier 60, and an emitter connected to ground. The NPN transistor Tr3 has a collector connected to the base of PNP transistor Tr53 (which is the input line of detection voltage Vs) in the differential amplifier 50, and an emitter connected to ground.

When the high level of switching signal S/H is input to the operational amplifier OP3, that is when the operational amplifier OP3 samples the detection voltage Vs, the NPN transistor Tr1 is off, and the NPN transistors Tr75 and Tr76 and PNP transistors Tr74 and Tr73 operate as the current mirror circuit. Therefore, current is supplied to the base of output transistor Tr71. In this situation, because the NPN transistor Tr2 is off, the NPN transistor Tr64 accurately operates, and current is supplied to the base of NPN transistor Tr72. Also, since the NPN transistor Tr3 is off, the input signal on the non-inverting input terminal (detection voltage Vs) is supplied to the differential pair of PNP transistors. Therefore, the output signal Vo which is the same voltage as the detection voltage Vs is output from the output terminal of the operational amplifier OP3.

In contrast, when the switching signal S/H sent from the microcomputer 10 is low, that is, when the detection voltage Vs is being held, the NPN transistor Tr1 is on, and the constant current supplied from the PNP transistor Tr78 flows to ground. Therefore, the current which flows through the second current mirror circuit formed by the NPN transistors Tr75 and Tr76 and the first current mirror circuit formed by the PNP transistors Tr74 and Tr73 is cut off. Therefore, the base current which flows to the output PNP transistor Tr71 is also cut off. Also, because the NPN transistor Tr2 is on and the base of NPN transistor Tr64 is grounded, the PNP transistor Tr64 is off, and the base of output NPN transistor Tr71 is at a high impedance. Thus, the output transistors Tr71 and Tr72 are off, and the output of the operational amplifier is open, which is a high impedance.

When the switching signal S/H is low, that is, the detection signal is being held, the NPN transistor Tr3 is on. Thus, the base of PNP transistor Tr53 connected to the non-inverting input terminal is grounded. Therefore, the PNP transistor Tr54 operates in the saturation region and the NPN transistor Tr58 is off. Because the collector of the PNP transistor Tr54 is connected to the base of the PNP transistor Tr56, the collector of PNP transistor Tr54 is at a high impedance. Further, because the emitter current of the PNP transistor Tr54 flows to ground, the differential amplifier 50 side of the phase compensation capacitor C61 is at a high impedance, and the potential stored in the phase compensation capacitor C61 is maintained. Thus, the voltage of the phase compensation capacitor C61 is fixed, and the output signal Vo, that is, the potential of the charge storage capacitor C2, is stable.

According to the operational amplifier OP3 of this embodiment, the output of the operational amplifier OP3 is opened by cutting off the output transistors Tr71 and Tr72. Further, the input line to which the detection voltage Vs is applied is grounded and the potential at the differential amplifier 50 side of phase compensation capacitor C61 is fixed while the detection voltage Vs is held. Thus, if the detection voltage Vs changes drastically because of changes in the operation voltage AFV of A/F sensor 2, the changed detection voltage Vs is not transferred to the push-pull output circuit 70 side of the phase compensation capacitor C61 as shown by dotted line in FIG. 7 (see curve B) because the potential of the phase compensation capacitor is fixed and AC coupling of the phase compensation capacitor C61 does not occur. As a result, the output signal Vo (potential of the charge storage capacitor C2) is not changed and is firmly fixed.

Therefore, according to the sample-and-hold circuit 14 of this embodiment, it is not necessary to dispose an analog switch between the operational amplifier OP3 and the charge storage capacitor C2, and the output voltage (detection signal AFO) can be prevented from changing while the detection voltage Vs is held. Thus, the sample-and-hold circuit 14 can hold a stable voltage without a MOS field effect transistor. Also, it is easy to integrate the air-fuel detecting apparatus except for the sample-and-hold circuit 14 and the A/F sensor 2. Further, in this embodiment, because the resistors R71 and R72 are disposed between the base and the emitter of each of the output transistors Tr71 and Tr72, when transistors Tr71 and Tr72 are off, no voltage can develop across the base and the emitter of each transistor Tr71 and Tr72. Therefore, transistors Tr71 and Tr72 are prevented from breaking down even if a high voltage is stored in the phase compensation capacitor C61. Further, because the bases of PNP transistors Tr74 and Tr73 forming a current mirror circuit are connected to the power line, even if current leaks in the bases of PNP transistors Tr74 and Tr73 while the detection voltage Vs is held, a bias current does not flow to the NPN transistor Tr71 through the PNP transistor Tr73. That is, a stable open condition can be kept while the detection voltage Vs is held because of the resistor R73 disposed in the first current mirror circuit.

(Second Embodiment)

Figure 5:
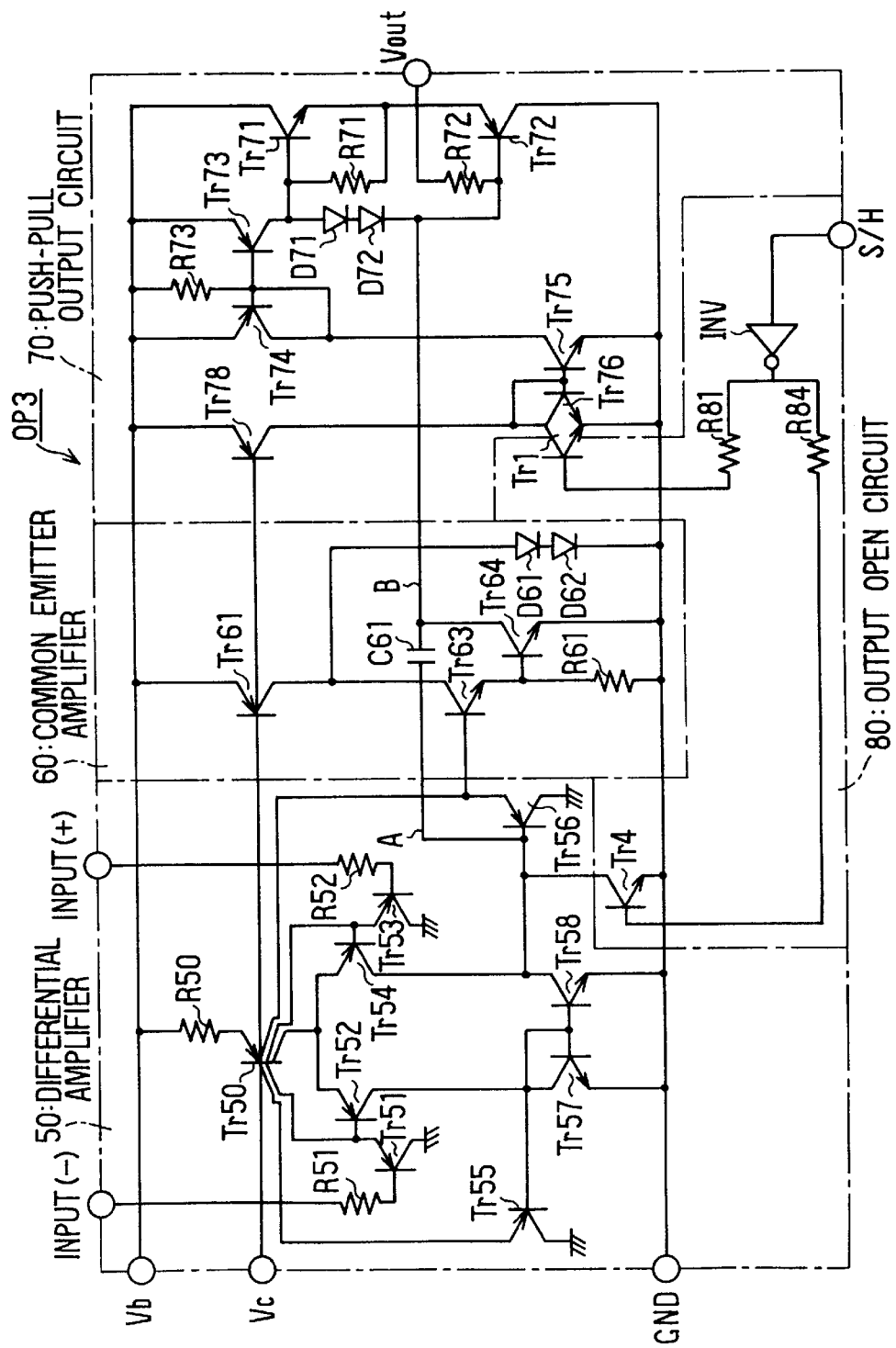
FIG. 5 is a circuit diagram of an operational amplifier OP3 included in the sample-and-hold circuit 14 shown in FIG. 1 according to a second embodiment.

The operational amplifier of a second embodiment shown in FIG. 5 is the same as that of the first embodiment except for the output open circuit 80 of the operational amplifier OP3. As shown in FIG. 5, the operational amplifier OP3 according to this embodiment has an NPN transistor Tr4 whose collector is connected to the base of the PNP transistor Tr56, whose emitter is connected to ground, and whose base is connected to the inverter INV through the resistor R84.

When the detection voltage Vs is held, the NPN transistors Tr1 and Tr4 in the output open circuit 80 are on. Therefore, the current supplied from the PNP transistor Tr73 to the phase compensation capacitor C61 is cut off, and the differential amplifier 50 side of the phase compensation capacitor C61 is grounded through the NPN transistor Tr4. Therefore, the output signal Vo is held without being influenced by the detection voltage Vs.

Figure 7:
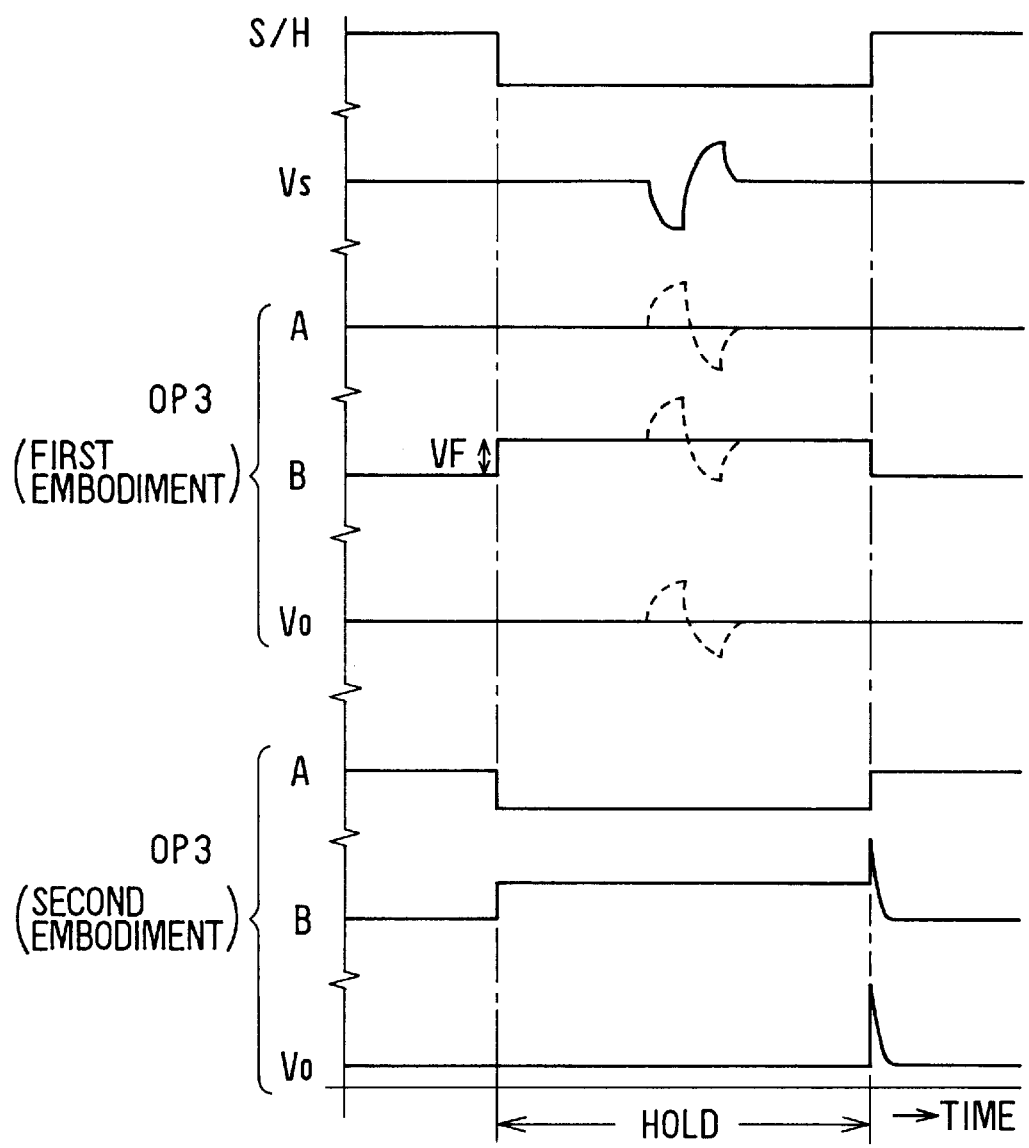
FIG. 7 is a timing chart indicating signals associated with the operational amplifier OP3 according to the first and second embodiments.

However, just after the switching signal S/H changes from a low level to a high level (just after the NPN transistor Tr4 is turned off), the potential at the differential amplifier 50 side of the phase compensation capacitor C61 (potential A) charges in response to the detection voltage Vs. Thus, the potential at the push-pull output circuit 70 side of the phase compensation capacitor C61 temporarily increases. Therefore, as shown in FIG. 7, a noise spike may be generated from the output terminal. Therefore, the sample-and-hold circuit having the operational amplifier OP3 of this embodiment should be used as a system in which the output signal is not output to the load when the circuit changes from sampling to holding.

(Third Embodiment)

Figure 6:
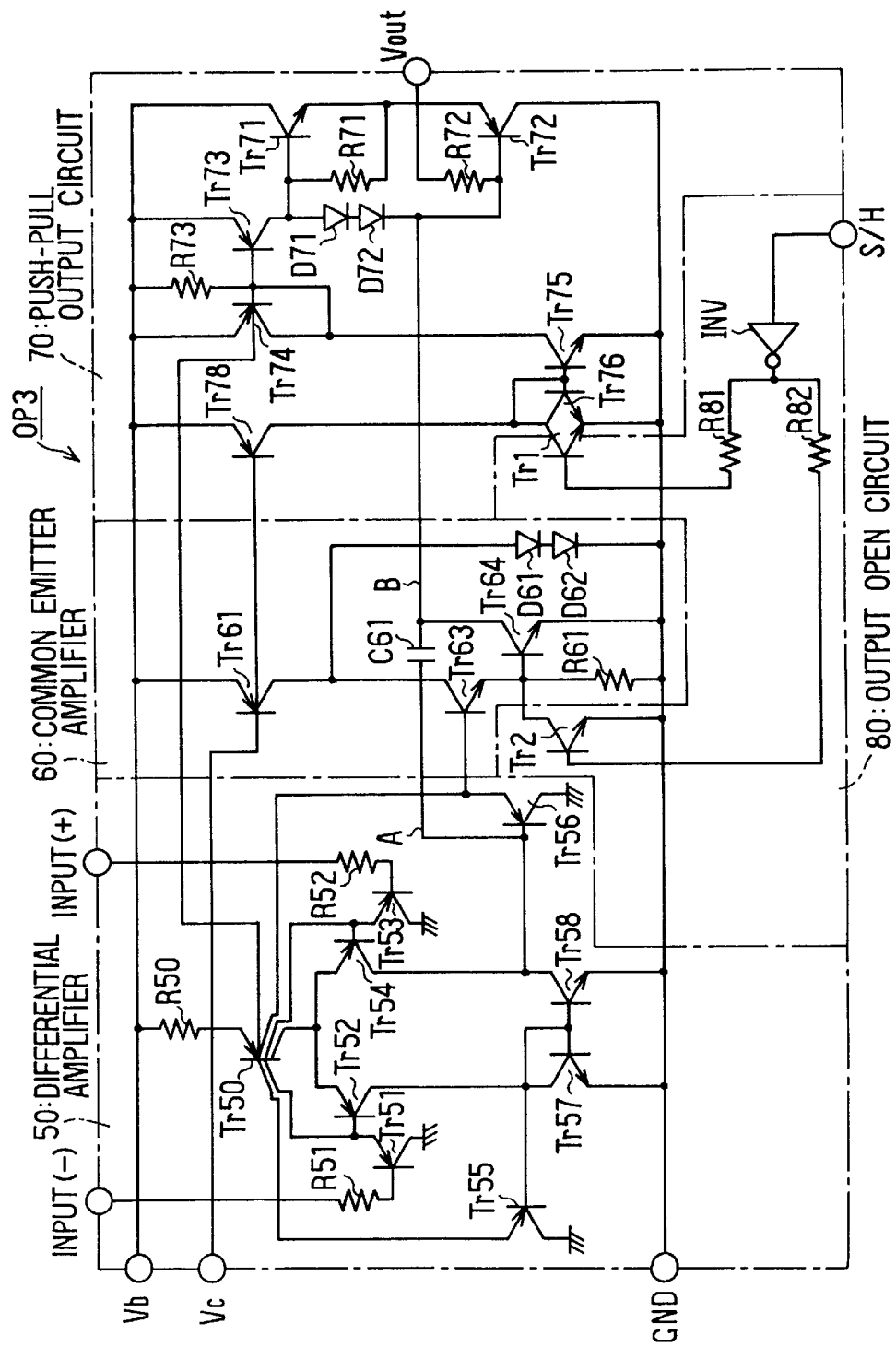
FIG. 6 is a circuit diagram of an operational amplifier OP3 included in the sample-and-hold circuit 14 shown in FIG. 1 according to a third embodiment.

The operational amplifier OP3 of a third embodiment shown in FIG. 6 is the same as that of first embodiment except for the output open circuit 80 of the operational amplifier OP3. According to the operational amplifier OP3 shown in FIG. 6, the base of the PNP transistor Tr50 is connected to the bases of the PNP transistors Tr73 and Tr74 which form the first current mirror circuit in the push-pull output circuit 70. Further, the bases of the PNP transistors Tr61 and Tr78 are supplied with the control signal Vc. When the switching signal S/H is at a high level and the transistor Tr1 is off, the PNP transistor Tr50 operates as the current source in the differential amplifier 50 because the currents which flow through the collectors of the PNP transistor Tr50 are the same as the current which flows through the PNP transistors Tr73 and Tr74. In contrast, when the switching signal S/H is at a low level and the transistor Tr1 is on, the current which flows through the collector of the PNP transistor Tr50 is cut off because the current which flows to the PNP transistors Tr73 and Tr74 is cut off. As a result, the operation of the differential amplifier 50 is stopped, and the voltage of the phase compensation capacitor C61 is fixed. Therefore, the operational amplifier OP3 of this embodiment can obtain the same effect as the operational amplifier OP3 of the first embodiment.

(Fourth Embodiment)

Figure 8:
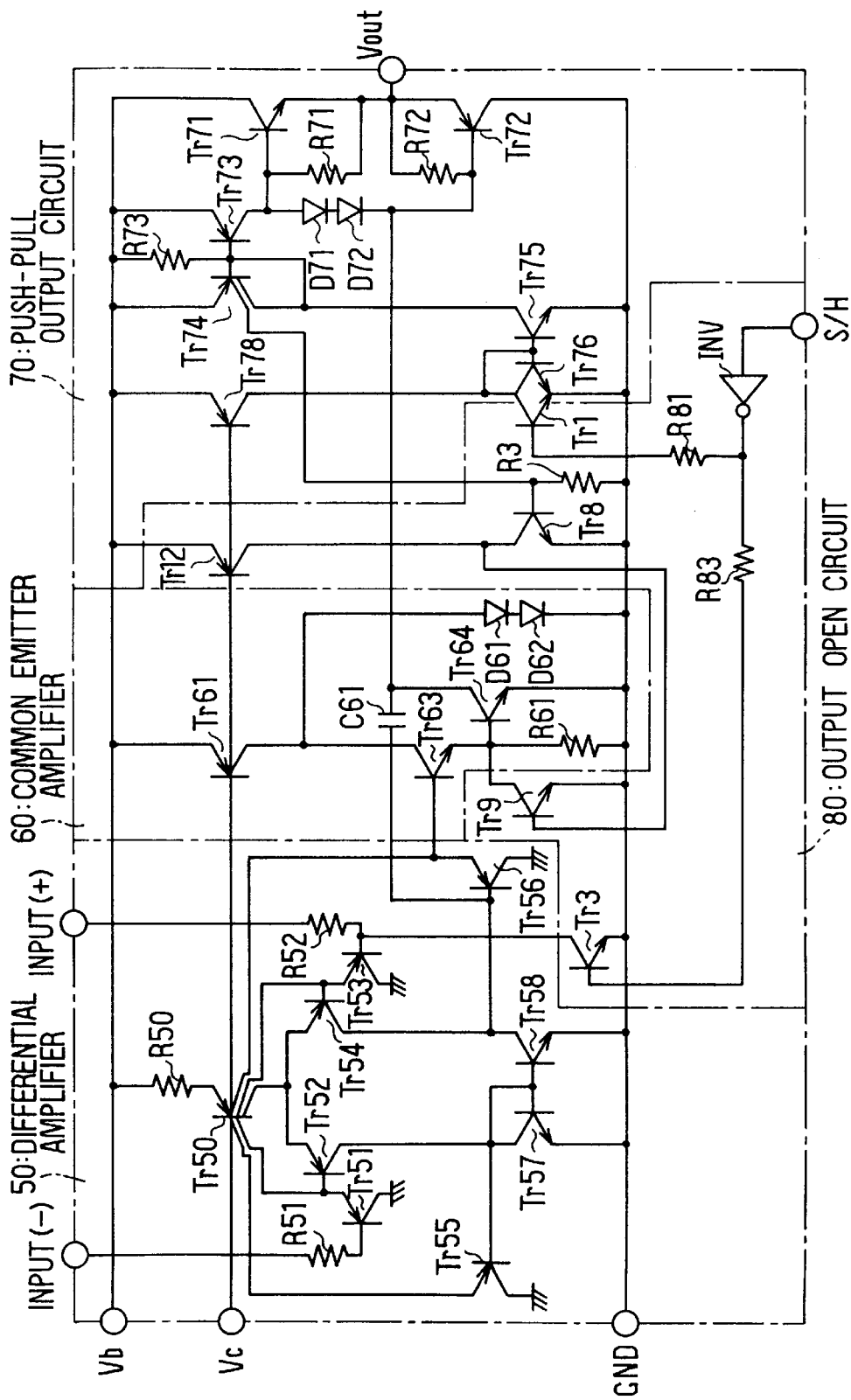
FIG. 8 is a circuit diagram of an operational amplifier OP3 included in the sample-and-hold circuit 14 shown in FIG. 1 according to a fourth embodiment.

The operational amplifier OP3 of a fourth embodiment is shown in FIG. 8. As shown in FIG. 8, the push-pull circuit 70 and the output open circuit 80 of the fourth embodiment are different from those of the first embodiment. In this embodiment, the output open circuit 80 has NPN transistors Tr8 and Tr9 and a PNP transistor Tr12 which cut off the signal output from the common emitter amplifier 60 when the PNP transistor Tr64 is off.

The PNP transistor Tr74 has two collectors. One is connected to the collector of the NPN transistor Tr75 and the other is connected to the base of the NPN transistor Tr8 and to ground through a resistor R3. The emitter of the NPN transistor Tr8 is connected to ground, and the collector of the NPN transistor Tr8 is connected to the collector of the PNP transistor Tr12. The emitter of the transistor Tr12 is connected to the power line. The base of the NPN transistor Tr9 is connected to the collector of the transistor Tr8 and the emitter of the transistor Tr9 is connected to ground.

The base of the PNP transistor Tr12 is connected to the control terminal which is received the control signal Vc with the bases of the PNP transistors Tr78, Tr50 and Tr61. The PNP transistor Tr12 is used as a current source supplying a constant current to the NPN transistor Tr8 from the power line. The collector of the NPN transistor Tr9 is connected to the base of the NPN transistor Tr64 which is used as the output transistor in the common emitter amplifier 60.

When the PNP transistor Tr74 is on, that is, when the first current mirror circuit comprising transistors Tr73 and Tr74 is activated, the NPN transistor Tr8 is on, and the constant current supplied from the PNP transistor Tr12 flows to ground. In contrast, when the first current mirror circuit is not activated, the NPN transistor Tr8 is off. When the NPN transistor Tr8 is off, the constant current supplied from the PNP transistor Tr12 flows to the base of the NPN transistor Tr9 to turn it on. When the NPN transistor Tr9 is on, the NPN transistor Tr64 is off because the base of the NPN transistor Tr64 is grounded through the transistor Tr9. Therefore, the signal which is input from the common emitter amplifier 60 to the push-pull output circuit 70 is cut off, and the output of the push-pull circuit 70 is open.

According to this embodiment, when the switching signal S/H is high level, the NPN transistor Tr1 is off, and the same constant current which flows through the PNP transistors Tr73 and Tr74, and the NPN transistors Tr75 and Tr76 as the current which flows to the PNP transistor Tr78. Therefore, the output transistors Tr71 and Tr72 are actively biased. In this situation, because the NPN transistor Tr9 is off, the signal corresponding the potential difference of the input signal imputed to the inverting input terminal (− input) and the non-inverting input terminal (+ input) is output from the common emitter amplifier 60. As a result, the voltage corresponding the above described signal is output from the output terminal of the push-pull output circuit 70.

When the switching signal S/H is low, the NPN transistor Tr1 is on, and the two current mirror circuits formed by the NPN transistors Tr76 and Tr75 and the PNP transistors Tr74 and Tr73 do not conduct. As a result, the base of the NPN transistor Tr71 is the same potential as the emitter of the same because the resistor R71 is connected between the base and the emitter of the NPN transistor Tr71. Thus, the NPN transistor Tr71 is in a stable off condition. When the PNP transistors Tr74 and Tr73 do not conduct, the NPN transistor Tr8 is off the NPN transistor Tr9 is on, and the NPN transistor Tr64 is off. In this situation, the base and the emitter of the NPN transistor Tr72 are at the same potential, because the resistor R72 is connected between the base and the emitter of NPN transistor Tr72. When the output transistors Tr71 and Tr72 of the push-pull output circuit 70 are off, the output transistors Tr71 and Tr72 do not break down even if a high voltage is applied to the output terminal from an outer resistor connected to the outer terminal. Thus, the output can be kept in a stable open condition.

Further, according to this embodiment, because the bases of the PNP transistors Tr74 and Tr73, forming the first current mirror circuit, are connected to the power line through the resistor R73, the PNP transistor Tr73 is not activated and bias current does not flow to the NPN transistor Tr71 even when current leaks in the bases with the output stopped. Thus, the resistor R73 leads to a more stable open condition.

In this embodiment, when the switching signal (low level) is input, the first current mirror circuit is deactivated, and the current supplied to the NPN transistor Tr71 is interrupted. Therefore, the output transistor Tr64 in the common emitter amplifier 60 is off, and the signal input to the PNP transistor Tr72 is interrupted. As a result, when the output is cut off, the NPN transistor Tr71 turns off first, and then the PNP transistor Tr72 turns off.

(Fifth Embodiment)

According to the fourth embodiment, the potential of the output terminal temporarily drops to ground when the output is cut off. If the external load connected to the operational amplifier can operate accurately in this condition, the potential problems are minimized. However, for other external loads, the potential of the output terminal of the operational amplifier should not drop to ground. The fifth embodiment is made in light of the foregoing problem. In the fifth embodiment, the order in which the output transistors Tr71 and Tr72 are switched off is different from that of the fourth embodiment.

Figure 9:
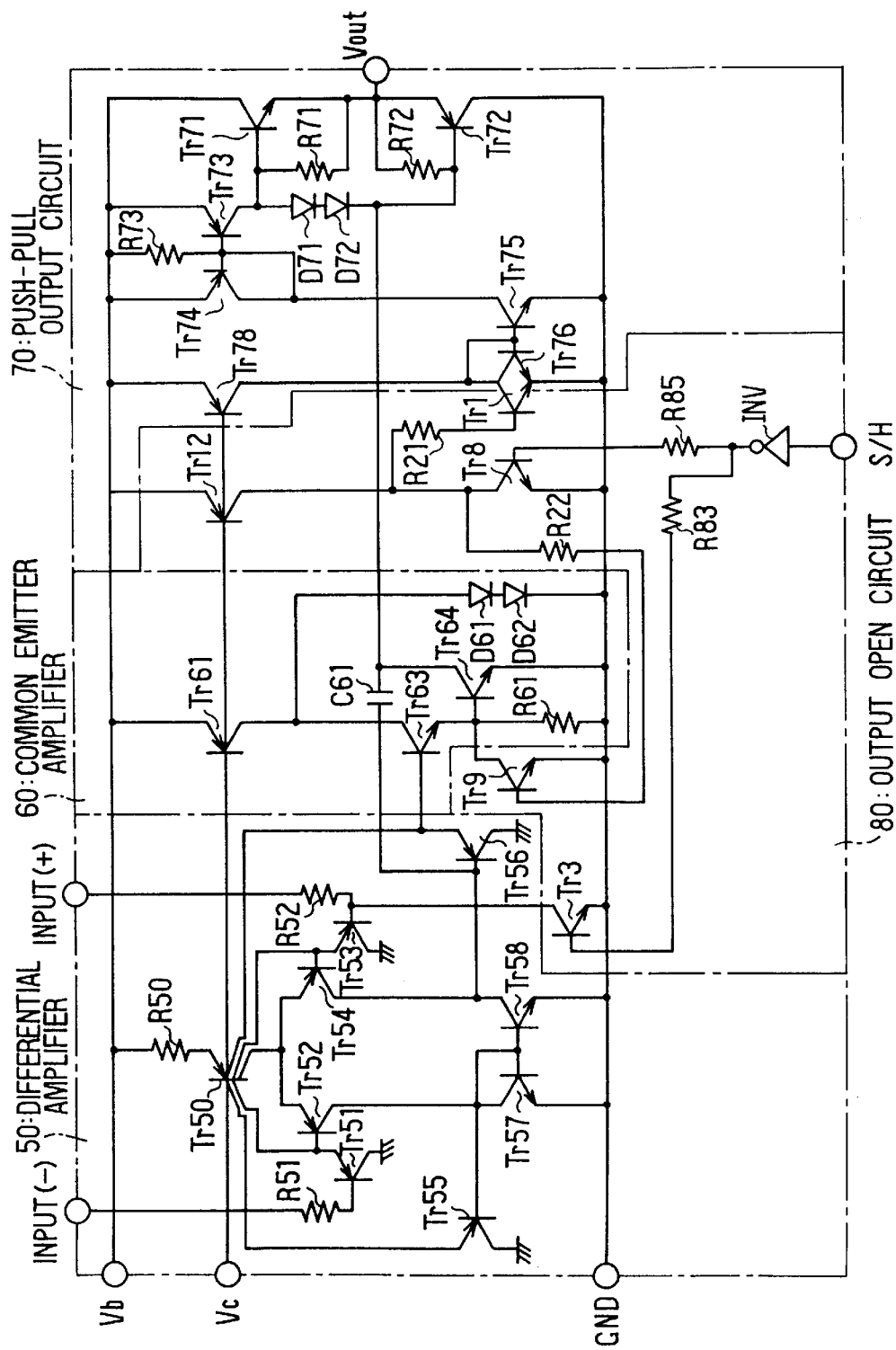
FIG. 9 is a circuit diagram of an operational amplifier OP3 included in the sample-and-hold circuit shown in FIG. 1 according to a fifth embodiment.

As shown in FIG. 9, the operational amplifier of this embodiment is the same as the fourth embodiment except for the push-pull circuit 70 and the output open circuit 80. In the push-pull circuit 70, the PNP transistor Tr74, forming the first current mirror circuit, has a single collector which is connected to its base. The base of the NPN transistor Tr1 is connected to the collector of the NPN transistor Tr8 through the resistor R21. The collector of the NPN transistor Tr8 is connected to the base of the NPN transistor Tr9 through the resistor R22. The input terminal for inputting the switching signal S/H is connected to the base of the NPN transistor Tr8 through the resistor R85.

According to the above-described operational amplifier, when the switching signal S/H is high level, the NPN transistor Tr8 is off and the NPN transistors Tr9 and Tr1 are on. When the NPN transistor Tr9 is on, the PNP transistor Tr72 is off because the output transistor (NPN transistor Tr64) of the common emitter amplifier 60 is off. Also, when the NPN transistor Tr1 is on, the transistors Tr76, Tr75, Tr74 and Tr73 which form the first and second current mirror circuits are off. Thus, the output NPN transistor Tr71 is turned off after the NPN transistor Tr72 is turned off. According to this embodiment, after the switching signal S/H becomes a high level, the PNP transistor 72 turns off first. Then, the NPN transistor Tr71 is turned off. Therefore, the potential of the output terminal temporarily increases to the voltage of the power source. Therefore, because the external load is not supplied with ground, but instead is supplied with the voltage of the power source, it is possible to solve the above-described problem. When the switching signal becomes low and the NPN transistor Tr8 is on, the operational amplifier is normally operated.

Figure 10A:
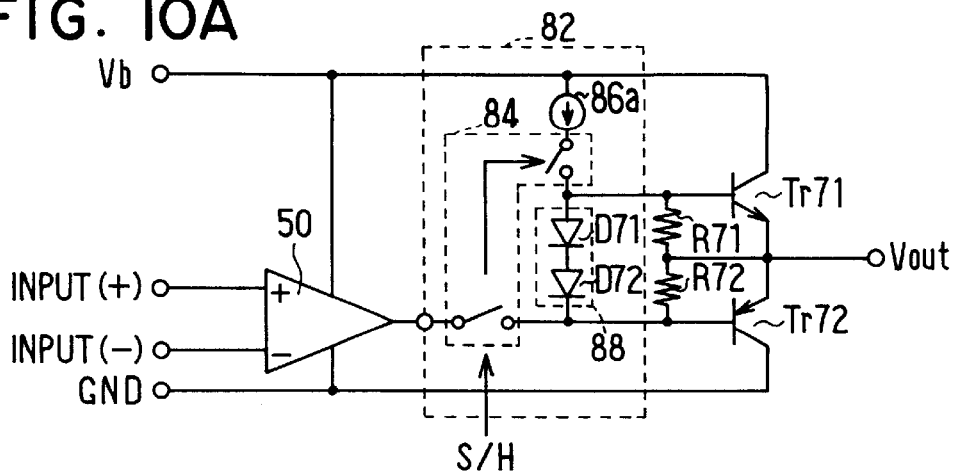
FIGS. 10A–10C are circuit diagrams of various push-pull circuits that can be used in the sample-and-hold circuit.

The present invention may be embodied in other specific forms without departing from the spirit or essential characteristics thereof. For example, the push-pull circuit 70 and the output open circuit 80 may alternatively be a circuit 82 shown in FIG. 10A. When the switching signal S/H is low, a switching circuit 84 included in the circuit 82 cuts off the bases of the NPN transistor Tr71 and the PNP transistor Tr72 from the differential amplifier 50 and also cuts off the diode D71 from a current source 86a such as a current mirror circuit.

Figure 10B:
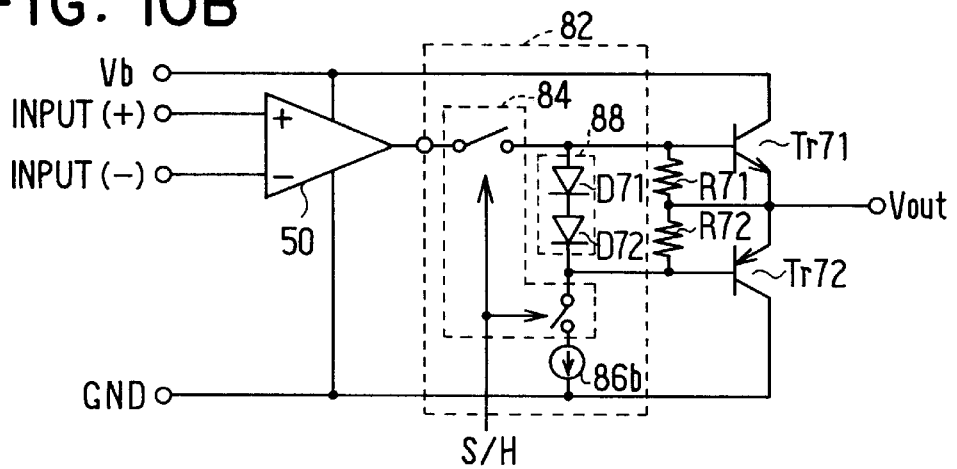
Figure 10C:
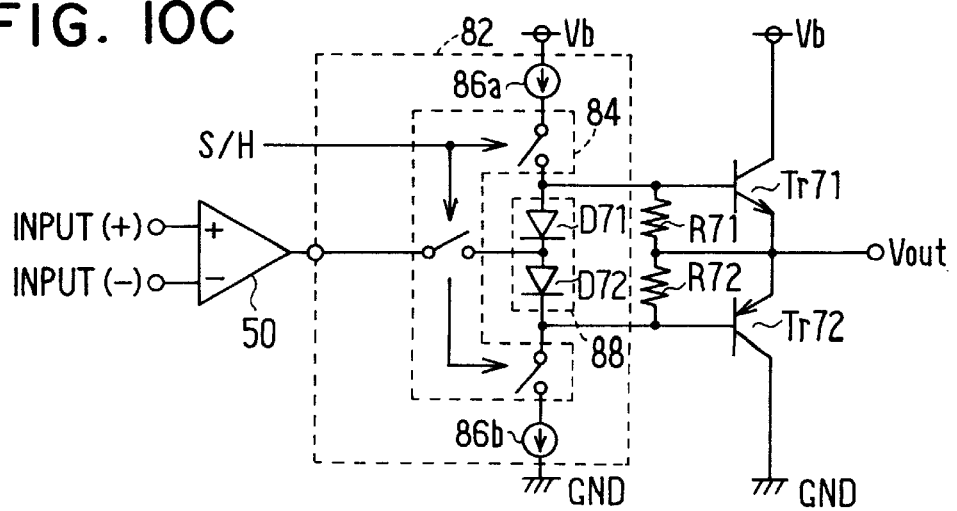

Other modifications are shown in FIGS. 10B and 10C. As shown in FIG. 10B, a current source 86b is disposed between ground and the diode D72, and when the switching signal S/H is low, the switching circuit 84 cuts off the bases of the NPN transistor Tr71 and the PNP transistor Tr72 from the differential amplifier 50 and also cuts off the diode D72 from a current source 86b such as a current mirror circuit. As shown in FIG. 10C, the current source 86a is disposed between the power line and the diode D71, and the current source 86b is disposed between ground and the diode D72. When the switching signal S/H is low, the switching circuit 84 cuts off the bases of NPN transistor Tr71 and PNP transistor Tr72 from the differential amplifier 50, cuts off the diode D71 from the current source 86a, and further cuts off the diode D72 from the current source 86b.

In the above-described embodiment, a push-pull circuit is employed as the output circuit of an operational amplifier. However, it is possible to use the push-pull circuit in other circuits, for instance, a comparator. The present invention can be adapted to any type of operational amplifier, for instance, an operational amplifier in which the phase compensation capacitor is disposed externally.

We claim:

1. A sample-and-hold circuit comprising:
 a charge storage capacitor having one terminal connected to a fixed potential;
 an operational amplifier having an output terminal and an inverting input terminal connected to another terminal of the charge storage capacitor, and a non-inverting input terminal supplied with an input signal, said operational amplifier having a phase compensation capacitor and a push-pull circuit including a first NPN transistor as one output transistor and a first PNP transistor as another output transistor, for charging the charge storage capacitor in response to the input signal supplied to the non-inverting input terminal thereof; and
 an output open circuit for cutting off the NPN transistor and the PNP transistor, and for fixing a potential stored on the phase compensation capacitor in response to a hold signal supplied to a hold signal input terminal different from the inverting input terminal and the non-inverting input terminal.

2. The sample-and-hold circuit according to claim 1, wherein the output open circuit applies a predetermined potential to the non-inverting input terminal of the operational amplifier via a switching circuit in order to fix the potential stored on the phase compensation capacitor.

3. The sample-and-hold circuit according to claim 2, wherein the output open circuit includes a switching means for fixing the non-inverting input terminal of the operational amplifier at the predetermined potential in response to the hold signal.

4. The sample-and-hold circuit according to claim 1, wherein the operational amplifier has a differential amplifier as an input circuit, and the output open circuit applies a predetermined voltage independent of the input signal between the differential amplifier and the phase compensation capacitor in order to fix the potential stored on the phase compensation capacitor.

5. The sample-and-hold circuit according to claim 1, wherein the operational amplifier has a differential amplifier including a constant current source as an input circuit, and the output open circuit stops the operation of the constant current source in order to fix the potential stored on the phase compensation capacitor.

6. The sample-and-hold circuit according to claim 1, wherein:

the operational amplifier has a signal input portion supplying an input signal to bases of the first NPN transistor and the first PNP transistor;

a collector of the first NPN transistor is connected to a high side of a power source and an emitter of the first NPN transistor is connected to an output terminal;

a collector of the first PNP transistor is connected to a low side of the power source and an emitter of the first PNP transistor is connected to an output terminal; and the output open circuit cuts off between the signal input portion and the bases of the first NPN transistor and the first PNP transistor.

7. The sample-and-hold circuit according to claim 1, further comprising a buffer circuit whose input terminal is connected to the other terminal of the charge storage capacitor, for outputting the potential stored in the charge storage capacitor.

8. The sample-and-hold circuit according to claim 1, wherein the output open circuit includes:

a first stopping means for stopping an operation of the first NPN transistor in response to the hold signal; and a second stopping means for stopping an operation of the first PNP transistor in response to the hold signal.

9. The sample-and-hold circuit according to claim 8, wherein:

the first stopping means includes a first switching means that operates in response to the hold signal; and the second stopping means includes a second switching means that operates in response to the hold signal.

10. A sample-and-hold circuit comprising:

a charge storage capacitor having one terminal connected to a fixed potential;

an operational amplifier having an output terminal and an inverting input terminal connected to another terminal of the charge storage capacitor, and a non-inverting input terminal supplied with an input signal, said operational amplifier having a phase compensation capacitor and a push-pull circuit including a first NPN transistor as one output transistor and a first PNP transistor as another output transistor, for charging the charge storage capacitor in response to the input signal supplied to the non-inverting input terminal thereof; and an output open circuit for cutting off the NPN transistor and the PNP transistor, and for fixing a potential stored on the phase compensation capacitor in response to a hold signal, wherein the push-pull circuit has a first resistor disposed between a base and an emitter of the NPN transistor and a second resistor disposed between a base and an emitter of the PNP transistor.

11. A sample-and-hold circuit comprising:

a charge storage capacitor having one terminal connected to a fixed potential;

an operational amplifier having an output terminal and an inverting input terminal connected to another terminal of the charge storage capacitor, and a non-inverting input terminal supplied with an input signal, said operational amplifier having a phase compensation capacitor and a push-pull circuit including a first NPN transistor as one output transistor and a first PNP transistor as another output transistor, for charging the charge storage capacitor in response to the input signal supplied to the non-inverting input terminal thereof; and an output open circuit for cutting off the NPN transistor and the PNP transistor, and for fixing a potential stored on the phase compensation capacitor in response to a hold signal, wherein:

the operational amplifier has a signal input portion supplying an input signal to bases of the first NPN transistor and the first PNP transistor;

a collector of the first NPN transistor is connected to a high side of a power source and an emitter of the first NPN transistor is connected to an output terminal;

a collector of the first PNP transistor is connected to a low side of the power source and an emitter of the first PNP transistor is connected to the output terminal;

the output open circuit cuts off between the signal input portion and the bases of the first NPN transistor and the first PNP transistor;

the signal input portion includes a first constant current circuit supplying a constant current from the high side of the power source to the base of the first NPN transistor, a second constant current circuit supplying a constant current from the base of the first PNP transistor to the low side of the power source, and a level shift circuit connected between the base of the first NPN transistor and the base of the first PNP transistor, for keeping the potential between the base of the first NPN transistor and the first PNP transistor at a predetermined difference to activate the first NPN transistor and the first PNP transistor; and the output open circuit stops the first and the second constant current circuits and cuts off the input signal supplied to the bases of the first NPN transistor and the first PNP transistor when the output circuit receives the hold signal.

12. The sample-and-hold circuit according to claim 11, wherein:

the first and the second constant current circuits and the output open circuit are formed with a plurality of bipolar transistors; and the output open circuit stops the first and the second constant current circuits and cuts off the input signal supplied to the bases of the first NPN transistor and the first PNP transistor in a predetermined order determined from switching delays of the bipolar transistors when the output circuit receives the hold signal.

13. A sample-and-hold circuit comprising:

a charge storage capacitor having one terminal connected to a fixed potential;

an operational amplifier having an output terminal and an inverting input terminal connected to another terminal of the charge storage capacitor, and a non-inverting input terminal supplied with an input signal, said operational amplifier having a phase compensation capacitor and a push-pull circuit including a first NPN transistor as one output transistor and a first PNP transistor as another output transistor, for charging the charge storage capacitor in response to the input signal supplied to the non-inverting input terminal thereof; and an output open circuit for cutting off the NPN transistor and the PNP transistor, and for fixing a potential stored on the phase compensation capacitor in response to a hold signal, wherein:

the operational amplifier has a signal input portion supplying an input signal to bases of the first NPN transistor and the first PNP transistor;

a collector of the first NPN transistor is connected to a high side of a power source and an emitter of the first NPN transistor is connected to an output terminal;

a collector of the first PNP transistor is connected to a low side of the power source and an emitter of the first PNP transistor is connected to the output terminal;

the output open circuit cuts off between the signal input portion and the bases of the first NPN transistor and the first PNP transistor;

the signal input portion includes a constant current circuit supplying a constant current from the base of the first PNP transistor to the low side of the power source, and a level shift circuit connected between the base of the first NPN transistor and the base of the first PNP transistor, for keeping the potential between the bases of the first NPN transistor and the first PNP transistor at a predetermined difference to operate the first NPN transistor and the first PNP transistor; and the output open circuit stops the constant current circuit and cuts off the input signal supplied to the base of the first NPN transistor when the output circuit receives the hold signal.

14. The sample-and-hold circuit according to claim 13, wherein:

the constant current circuit and the output open circuit are formed with a plurality of bipolar transistors; and the output open circuit stops the constant current circuit and cuts off the input signal supplied to the base of the first NPN transistor in a predetermined order determined from switching delays of the bipolar transistors when the output circuit receives the hold signal.

15. A sample-and-hold circuit comprising:

a charge storage capacitor having one terminal connected to a fixed potential;

an operational amplifier having an output terminal and an inverting input terminal connected to another terminal of the charge storage capacitor, and a non-inverting input terminal supplied with an input signal, said operational amplifier having a phase compensation capacitor and a push-pull circuit including a first NPN transistor as one output transistor and a first PNP transistor as another output transistor, for charging the charge storage capacitor in response to the input signal supplied to the non-inverting input terminal thereof; and an output open circuit for cutting off the NPN transistor and the PNP transistor, and for fixing a potential stored on the phase compensation capacitor in response to a hold signal, wherein:

the operational amplifier has a signal input portion supplying an input signal to bases of the first NPN transistor and the first PNP transistor;

a collector of the first NPN transistor is connected to a high side of a power source and an emitter of the first NPN transistor is connected to an output terminal;

a collector of the first PNP transistor is connected to a low side of the power source and an emitter of the first PNP transistor is connected to the output terminal;

the output open circuit cuts off between the signal input portion and the bases of the first NPN transistor and the first PNP transistor;

the signal input portion includes a constant current circuit supplying a constant current from the high side of the power source to the base of the first NPN transistor, and a level shift circuit connected between the base of the first NPN transistor and the base of the first PNP transistor, for keeping the potential between the bases of the first NPN transistor and the first PNP transistor at a predetermined difference to operate the first NPN transistor and the first PNP transistor; and the output open circuit stops the constant current circuit and cuts off the input signal supplied to the base of the first PNP transistor when the output circuit receives the hold signal.

16. The sample-and-hold circuit according to claim 15, wherein:

the constant current circuit and the output open circuit are formed with a plurality of bipolar transistors; and the output open circuit stops the first constant current circuits and cuts off the input signal supplied to the base of the first PNP transistor in a predetermined order determined from switching delays of the bipolar transistors when the output circuit receives the hold signal.

17. The sample-and-hold circuit according to claim 15, wherein the constant current circuit includes:

a second PNP transistor having an emitter connected to the high side of the power source and a collector connected to the base of the first NPN transistor, a third PNP transistor having an emitter connected to the high side of the power source, a base connected to a base of the second PNP transistor, a first collector connected to the base of the third PNP transistor, and a second collector, the third PNP transistor and the second PNP transistor forming a first current mirror circuit, a second NPN transistor having a collector connected to the first collector of the third PNP transistor and an emitter connected to low side of the power source, a third NPN transistor having an emitter connected to the low side of the power source, a base connected to a base of the second NPN transistor and a collector connected to the base of the third NPN transistor, the third NPN transistor and the second NPN transistor forming a second current mirror circuit, and a first current source disposed between the high side of the power source and a collector of the third NPN transistor; and the output open circuit includes:

a fourth NPN transistor having a collector connected to the collector of the third NPN transistor and an emitter connected to the emitter of the third NPN transistor, the current flowing through the second current mirror circuit and the current flowing through the first current mirror circuit being sequentially cut off when the hold signal is supplied to the base of the fourth NPN transistor, a fifth NPN transistor having a base connected to the second collector of the third PNP transistor and with the low side of the power source through a resistor, and an emitter connected to the low side of the power source, a signal input transistor supplying the input signal to the base of the first PNP transistor, and a sixth NPN transistor having a base connected to a collector of the fifth NPN transistor, an emitter connected to the low side of the power source and a collector connected to a base of the signal input transistor, the sixth NPN transistor cutting off the input signal by turning off the signal input transistor when the fifth NPN transistor is off.

18. The sample-and-hold circuit according to claim 17, wherein, the shift level circuit includes:

a first diode having an anode connected to the base of the first NPN transistor, and a second diode having an anode connected to a cathode of the first diode and a cathode connected to the base of the first PNP transistor.

19. The sample-and-hold circuit according to claim 15, wherein the constant current circuit includes:
- a second PNP transistor having an emitter connected to the high side of the power source and a collector connected to the base of the first NPN transistor,
- a third PNP transistor having an emitter connected to the high side of the power source, a base connected to a base of the second PNP transistor, a collector connected to its base, the third PNP transistor and the second PNP transistor forming a first current mirror circuit,
- a second NPN transistor having a collector connected to the collector of the third PNP transistor and an emitter connected to low side of the power source,
- a third NPN transistor having an emitter connected to the low side of the power source, a base connected to a base of the second NPN transistor and a collector connected to the base of the third NPN transistor, the third NPN transistor and the second NPN transistor forming a second currant mirror circuit, and
- a first current source disposed between the high side of the power source and a collector of the third NPN transistor; and the output open circuit includes:
- a fourth NPN transistor having a collector connected to the collector of the third NPN transistor and an emitter connected to the emitter of the third NPN transistor,
- a fifth NPN transistor having an emitter connected to the low side of the power source, a collector connected to a base of the fourth NPN transistor and a base connected to the hold signal, the current flowing the second current mirror circuit and the first current mirror circuit being cut off when the hold signal is applied to the base of the fifth NPN transistor,
- a signal input transistor supplying the input signal to the base of the first PNP transistor, and
- a sixth NPN transistor having a base connected to a collector of the fifth NPN transistor, an emitter connected to the low side of the power source and a collector connected to a base of the signal input transistor, the sixth NPN transistor cutting off the input signal by turning off the signal input transistor when the fifth NPN transistor is off.

* * * * *